(12) United States Patent
Li

(10) Patent No.: US 11,632,878 B2
(45) Date of Patent: Apr. 18, 2023

(54) ADD-IN MODULE

(71) Applicant: Shannon Systems Ltd., Shanghai (CN)

(72) Inventor: Jiangshan Li, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 30 days.

(21) Appl. No.: 17/468,911

(22) Filed: Sep. 8, 2021

(65) Prior Publication Data

US 2022/0369515 A1 Nov. 17, 2022

(30) Foreign Application Priority Data

May 14, 2021 (CN) .......................... 202121041975.0

(51) Int. Cl.
| | | |
|---|---|---|
| *H05K 7/20* | (2006.01) | |
| *G06F 1/18* | (2006.01) | |
| *G06F 1/20* | (2006.01) | |
| *H01L 23/40* | (2006.01) | |

(52) U.S. Cl.
CPC ......... *H05K 7/20409* (2013.01); *G06F 1/187* (2013.01); *G06F 1/20* (2013.01); *H01L 23/4006* (2013.01); *H05K 7/20472* (2013.01); *H01L 2023/4068* (2013.01)

(58) Field of Classification Search
CPC ............ H05K 7/20409; H05K 7/20472; G06F 1/187; G06F 1/20; H01L 23/4006; H01L 23/4068
See application file for complete search history.

(56) References Cited

U.S. PATENT DOCUMENTS

| | | | | |
|---|---|---|---|---|
| 9,894,805 | B2* | 2/2018 | Kim | F28D 21/00 |
| 10,085,364 | B2* | 9/2018 | Voss | H05K 7/20436 |
| 10,186,471 | B2* | 1/2019 | Chen | G06F 1/20 |
| 10,314,160 | B2* | 6/2019 | Suzuki | H05K 7/20163 |
| 10,582,644 | B1* | 3/2020 | Hur | H05K 7/20454 |
| 10,798,839 | B2* | 10/2020 | Gao | G06F 1/203 |
| 10,869,383 | B2* | 12/2020 | Suzuki | H05K 5/0008 |
| 11,153,964 | B2* | 10/2021 | Suzuki | H05K 1/18 |
| 11,272,640 | B2* | 3/2022 | Hur | H05K 1/181 |
| 11,558,980 | B2* | 1/2023 | Hur | H05K 7/20472 |
| 2020/0260602 | A1* | 8/2020 | Gao | H05K 7/20418 |

\* cited by examiner

*Primary Examiner* — Robert J Hoffberg
(74) *Attorney, Agent, or Firm* — McClure, Qualey & Rodack, LLP

(57) ABSTRACT

An add-in module is provided. The add-in module includes a substrate, a plurality of first heat sources, a plurality of second heat sources, a heat sink and a heat-dissipation plate. The substrate includes a first substrate surface and a second substrate surface. The first substrate surface is opposite the second substrate surface. The first heat sources are disposed on the first substrate surface. The second heat sources are disposed on the second substrate surface. The heat sink corresponds to the first substrate surface and is thermally connected to the first heat sources, wherein the heat sink includes a heat-sink base and a plurality of heat-dissipation fins, and the heat-dissipation fins are connected to the heat-sink sink base. The heat-dissipation plate corresponds to the second substrate surface and is thermally connected to the second heat sources.

3 Claims, 6 Drawing Sheets

ADD-IN MODULE

CROSS REFERENCE TO RELATED APPLICATIONS

This Application claims priority of China Patent Application No. 202121041975.0, filed on May 14, 2021, the entirety of which is incorporated by reference herein.

BACKGROUND OF THE INVENTION

Field of the Invention

The present invention relates to an add-in module, and in particular to an add-in module with a heat-dissipation plate.

Description of the Related Art

The add-in module (such as a solid-state disk) is connected to an electronic device (such as a computer or a server). The gap between the add-in module and the adjacent electronic elements is small. Therefore, a conventional add-in module has only one heat sink, and the heat sink is disposed on one side of the add-in module (to prevent interference between the heat sink and the adjacent electronic elements). With the increased requirement of the function of the add-in module, there are chips disposed on both sides of the add-in module, and the chips generate great heat. Some of the chips are not thermally connected to the heat sink, the temperature of these chips may be raised too high, and the reliability of the add-in module is deteriorated. For example, the chips may be overheated, and the add-in module may be damaged.

BRIEF SUMMARY OF THE INVENTION

Embodiments of the invention are provided to address the aforementioned difficulty.

In one embodiment, an add-in module is provided. The add-in module includes a substrate, a plurality of first heat sources, a plurality of second heat sources, a heat sink and a heat-dissipation plate. The substrate includes a first substrate surface and a second substrate surface, wherein the first substrate surface is opposite the second substrate surface. The first heat sources are disposed on the first substrate surface. The second heat sources are disposed on the second substrate surface. The heat sink corresponds to the first substrate surface and is thermally connected to the first heat sources, wherein the heat sink comprises a heat-sink base and a plurality of heat-dissipation fins, and the heat-dissipation fins are connected to the heat-sink base. The heat-dissipation plate corresponds to the second substrate surface and is thermally connected to the second heat sources.

In one embodiment, the first heat sources comprise a central processor chip and a plurality of first memory chips, and the second heat sources comprise a plurality second memory chips.

In one embodiment, the add-in module further comprises a plurality of first heat-conductive elements, each first heat-conductive element is disposed between each first heat source and the heat-sink base, and the first heat-conductive element is thermally connected to the first heat source and the heat-sink base.

In one embodiment, the add-in module further comprises a plurality of second heat-conductive elements, each second heat-conductive element is disposed between each second heat source and the heat-dissipation plate, and the second heat-conductive element is thermally connected to the second heat source and the heat-dissipation plate.

In one embodiment, the add-in module further comprises a plurality of fasteners, wherein the fasteners are affixed to the substrate, the heat sink and the heat-dissipation plate.

In one embodiment, the heat-dissipation plate comprises a plurality of protruding portions, the fasteners pass through the protruding portions, each protruding portion has a top surface, and the top surface abuts the second substrate surface.

In one embodiment, the heat sink comprises a plurality of posts. Each post comprises a fastening hole. The posts correspond to the protruding portions. Each fastener passes through the corresponding protruding portion and is affixed to the fastening hole of the corresponding post.

In one embodiment, the add-in module further comprises a bracket, which comprises a plurality of bracket fastening portions. The fasteners comprise a plurality of first fasteners. The posts comprise a plurality of first posts. The first fasteners pass through the corresponding protruding portions, the substrate, and the bracket fastening portions and are affixed to the first posts.

In one embodiment, the fasteners comprise a plurality of second fasteners. The posts comprise a plurality of second posts. The second fasteners pass through the corresponding protruding portions and the substrate. The second fasteners are affixed to the second posts. The first posts abut the bracket fastening portions. The second posts abut the substrate.

In one embodiment, the add-in module further comprises a capacitor, wherein the capacitor is disposed on the first substrate surface, a base notch is formed on the heat-sink base, and the capacitor passes through the base notch.

In the add-in module of the embodiment of the invention, the heat sink removes the heat from the first heat sources which are disposed on the first substrate surface, and the heat-dissipation plate removes the heat from the second heat sources which are disposed on the second substrate surface. The heat generated by the heat sources (including the first heat sources and the second heat sources) can be effectively removed. The temperature of the all heat sources is prevented from being raised too high. The heat sources are prevented from being overheated, and the add-in module is prevented from being damaged. The add-in module thus has improved reliability. Additionally, the heat-dissipation plate is a thin plate, and the heat-dissipation plate is prevented from being interfered with other adjacent elements.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
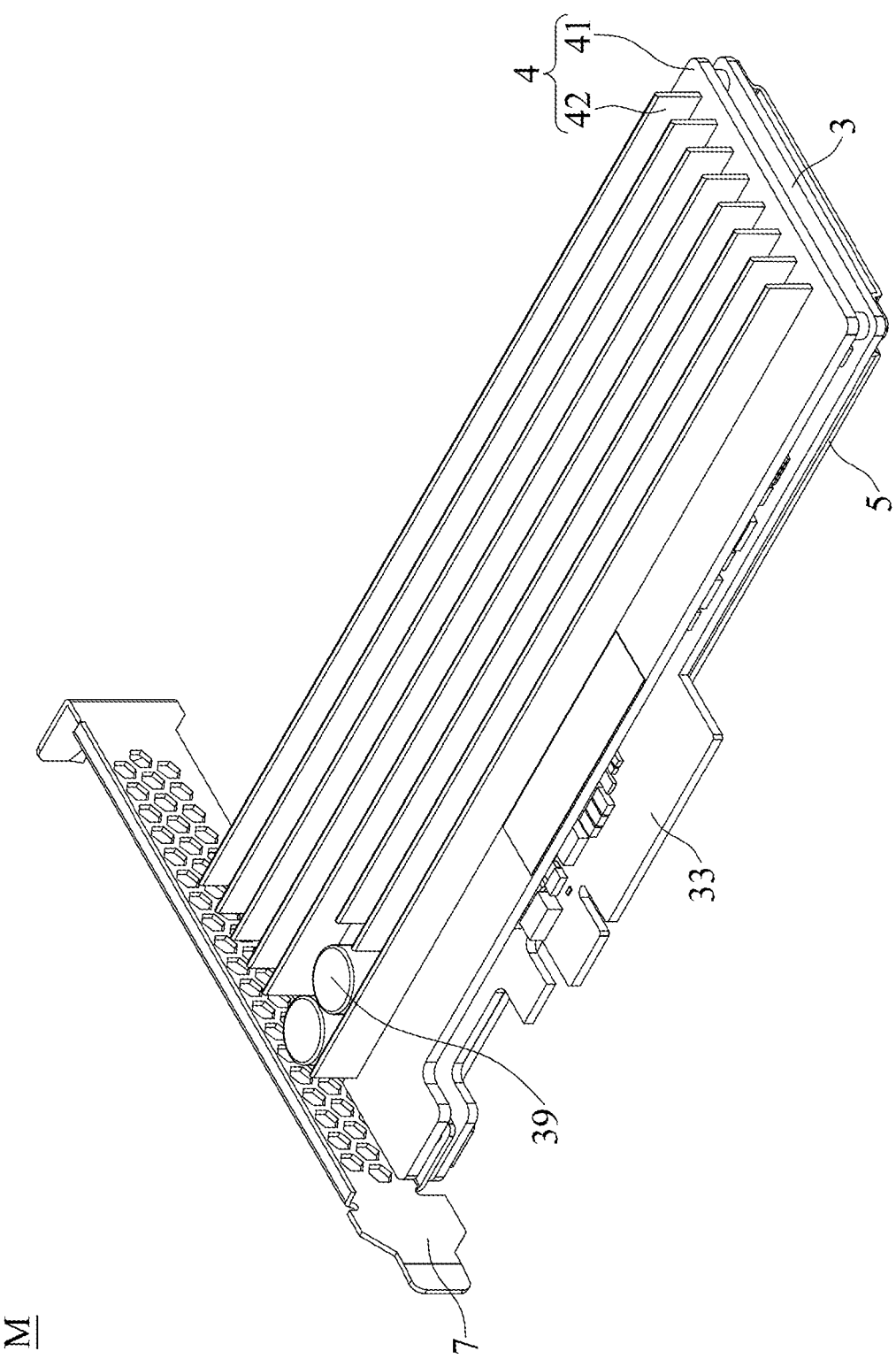
FIG. 1A is a perspective view of an add-in module of an embodiment of the invention.
Figure 1B:
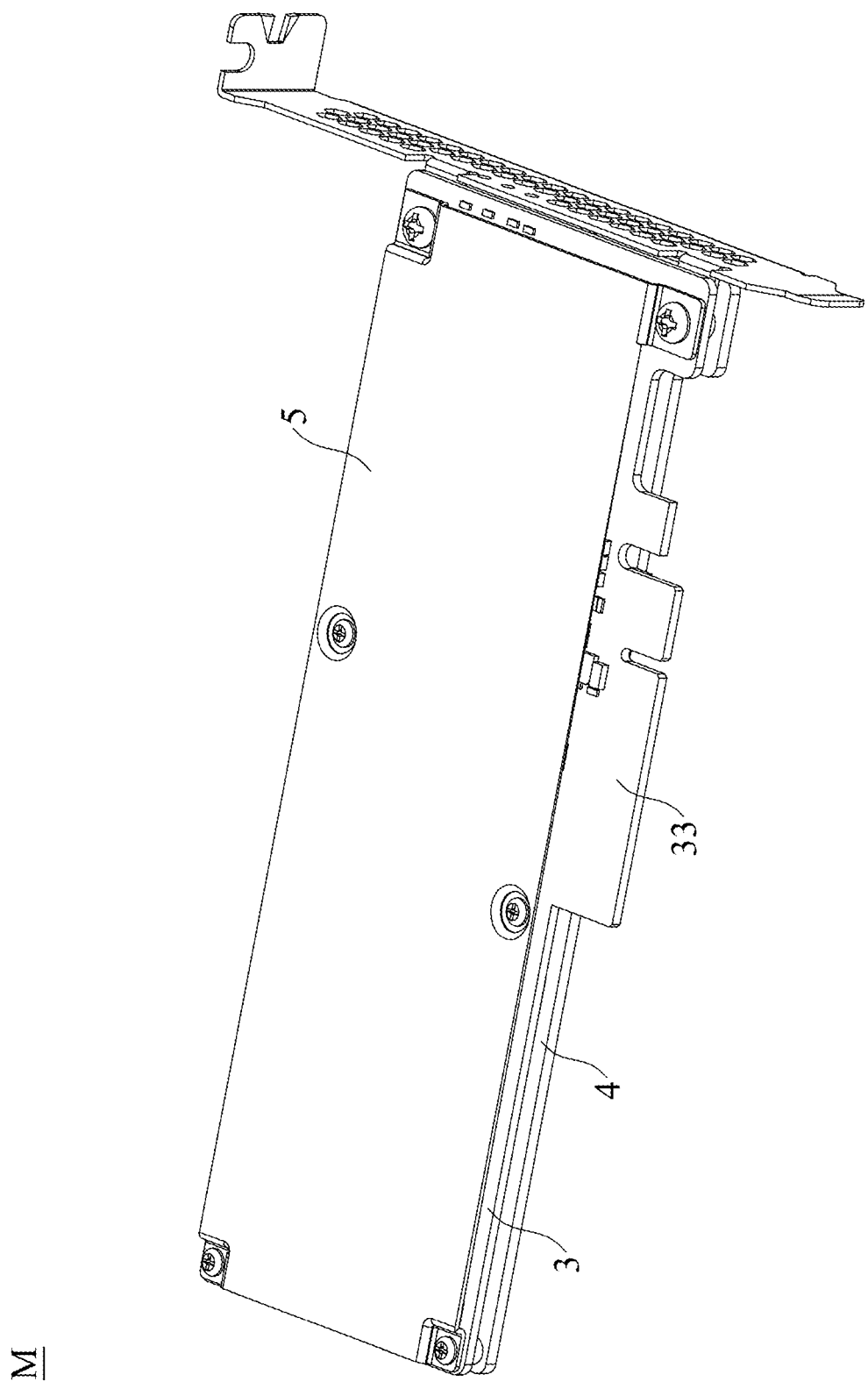
FIG. 1B is another perspective view of the add-in module of the embodiment of the invention.
Figure 2A:
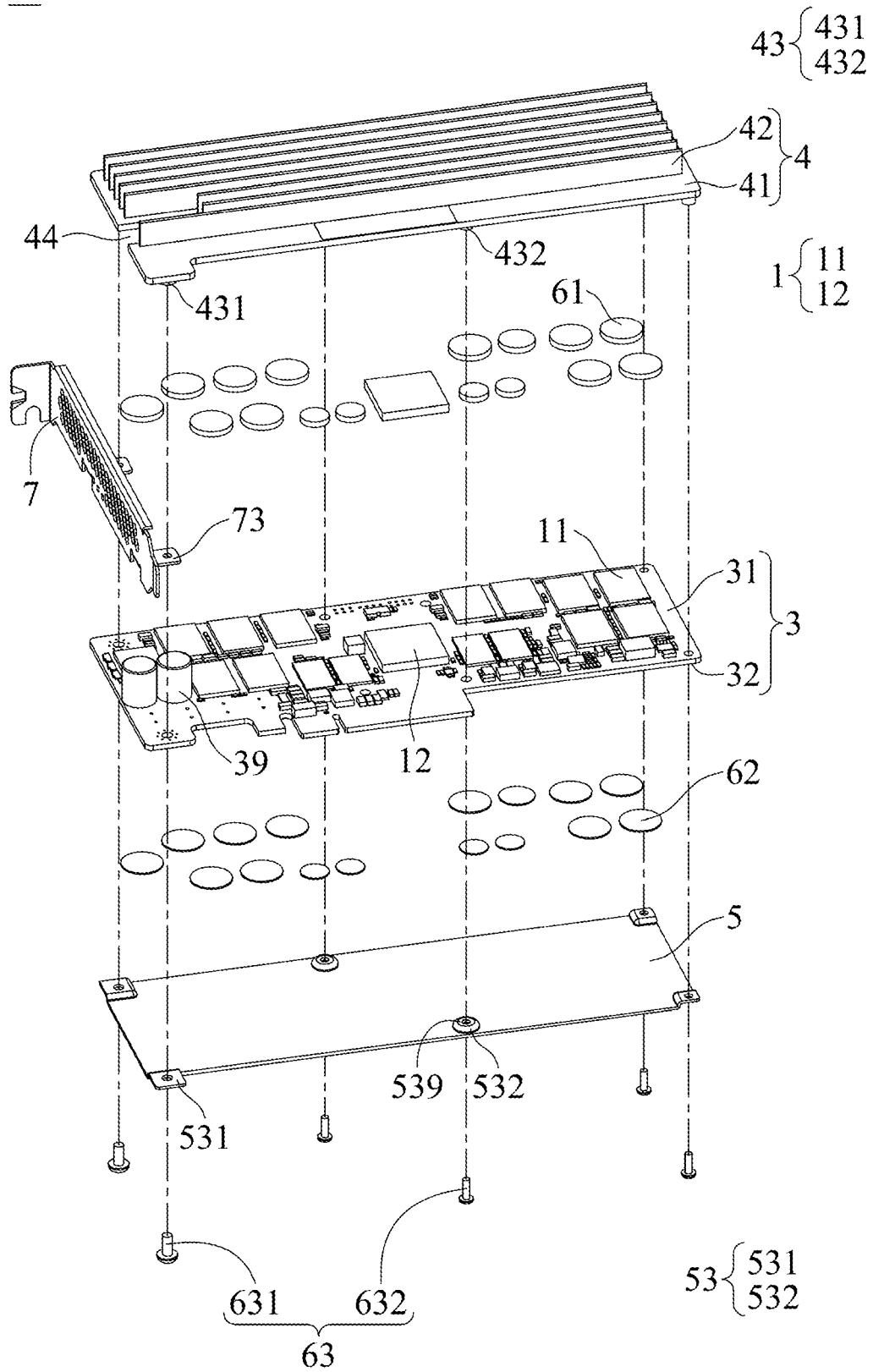
FIG. 2A is an exploded view of the add-in module of the embodiment of the invention.
Figure 2B:
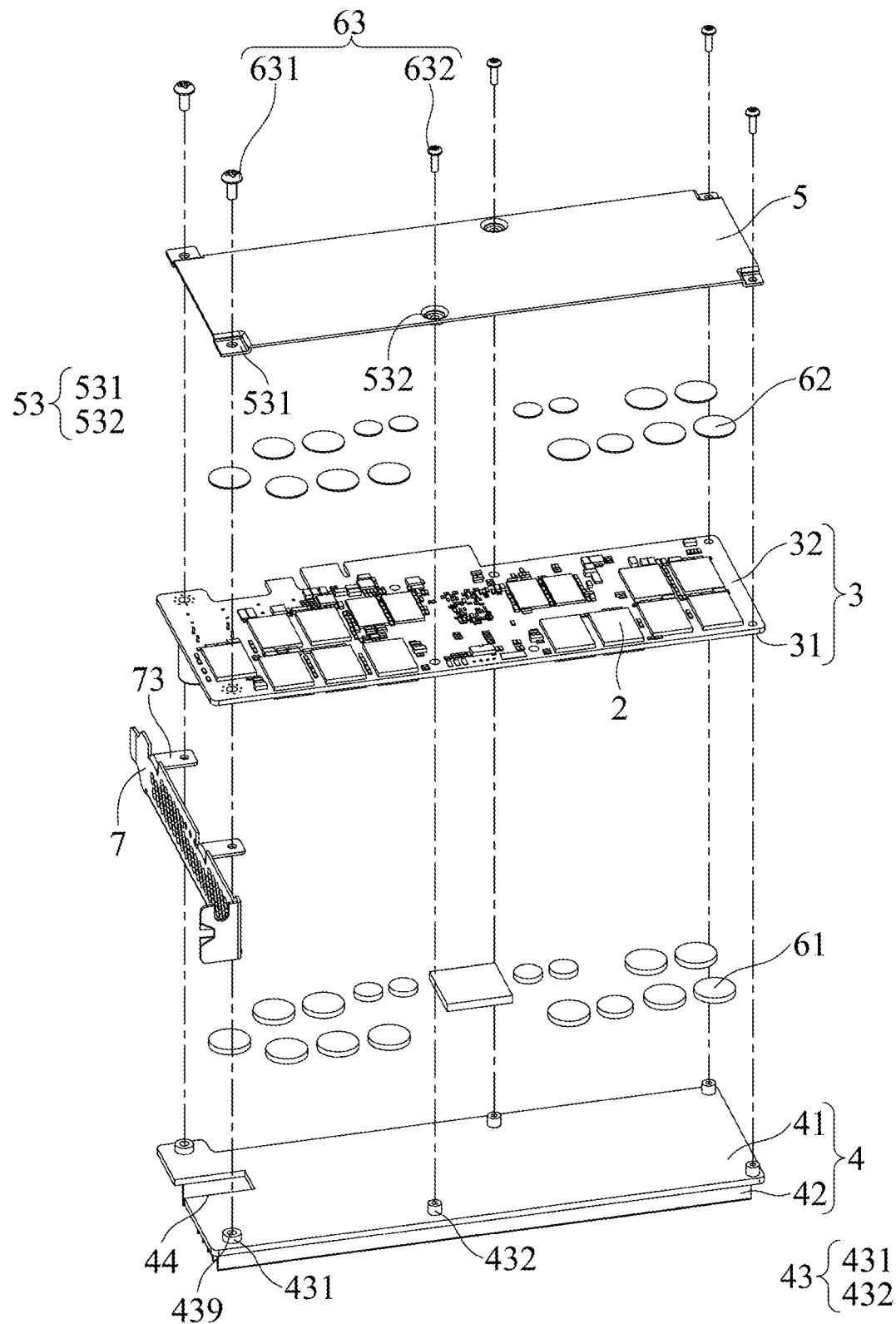
FIG. 2B is another exploded view of the add-in module of the embodiment of the invention.

FIG. 1A is a perspective view of an add-in module of an embodiment of the invention. FIG. 1B is another perspective view of the add-in module of the embodiment of the invention. FIG. 2A is an exploded view of the add-in module of the embodiment of the invention. FIG. 2B is another exploded view of the add-in module of the embodiment of the invention. With reference to FIGS. 1A, 1B, 2A and 2B, the add-in module M of the embodiment of the invention includes a substrate 3, a plurality of first heat sources 1, a plurality of second heat sources 2, a heat sink 4 and a heat-dissipation plate 5. The substrate 3 includes a first substrate surface 31 and a second substrate surface 32. The first substrate surface 31 is opposite the second substrate surface 32. The first heat sources 1 are disposed on the first substrate surface 31. The second heat sources 2 are disposed on the second substrate surface 32. The heat sink 4 corresponds to the first substrate surface 31 and is thermally connected to the first heat sources 1. The heat sink 4 comprises a heat-sink base 41 and a plurality of heat-dissipation fins 42. The heat-dissipation fins 42 are connected to the heat-sink base 41. The heat-dissipation plate 5 corresponds to the second substrate surface 32 and is thermally connected to the second heat sources 2.

With reference to FIGS. 2A and 2B, in one embodiment, the first heat sources 1 comprise a central processor chip 12 and a plurality of first memory chips 11. The second heat sources 2 comprise a plurality second memory chips. In one embodiment, the first memory chips 11 can include DRAM, RAM, Flash Memory and ROM. In one embodiment, the central processor chip 12 is located in the center of the substrate 3, and is located between the first memory chips 11. The disclosure is not meant to restrict the invention.

In one embodiment, the add-in module can be a solid-state disk. The disclosure is not meant to restrict the invention. The add-in module can also be a graphics card or add-in module of other functions. With reference to FIGS. 1A and 1B, the substrate 3 can further comprises a port 33. The port 33 can be, for example, PCIE port. The port 33 can have a plurality of gold fingers (not shown).

With reference to FIG. 2A, in one embodiment, the add-in module M further comprises a plurality of first heat-conductive elements 61. Each first heat-conductive element 61 is disposed between each first heat source 1 and the heat-sink base 41. The first heat-conductive element 61 is thermally connected to the first heat source 1 and the heat-sink base 41.

With reference to FIG. 2B, in one embodiment, the add-in module M further comprises a plurality of second heat-conductive elements 62. Each second heat-conductive element 62 is disposed between each second heat source 2 and the heat-dissipation plate 5. The second heat-conductive element 62 is thermally connected to the second heat source 2 and the heat-dissipation plate 5.

In one embodiment, the first heat-conductive elements 61 and the second heat-conductive elements 62 can be thermal pad, thermal grease or other heat conductive materials.

With reference to FIGS. 2A and 2B, in one embodiment, the add-in module M further comprises a plurality of fasteners 63. The fasteners 63 are affixed to the substrate 3, the heat sink 4 and the heat-dissipation plate 5. In one embodiment, the fasteners 63 comprise a plurality of first fasteners 631 and a plurality of second fasteners 632. The diameter of the first fasteners 631 is greater than the diameter of the second fasteners 632.

With reference to FIGS. 2A and 2B, in one embodiment, the heat-dissipation plate 5 comprises a plurality of protruding portions 53. The fasteners 63 pass through the protruding portions 53. Each protruding portion 53 has a top surface 539, and the top surface 539 abuts the second substrate surface 32 of the substrate 3. In this embodiment, the protruding portions 53 include first protruding portions 531 and second protruding portions 532. In one embodiment, the shapes of the protruding portions 53 (including the first protruding portions 531 and the second protruding portions 532) can the same or different to each other. The protruding portions 53 can be formed by punching, and the heat-dissipation plate 5 can be a copper plate, an aluminum plate or metal plate of other materials.

With reference to FIGS. 2A and 2B, in one embodiment, the heat sink 4 comprises a plurality of posts 43. Each post 43 comprises a fastening hole 439. The posts 43 correspond to the protruding portions 53. Each fastener 63 passes through the corresponding protruding portion 53 and is affixed to the fastening hole 439 of the corresponding post 43. In one embodiment, the fasteners 63 thermally connect the heat-dissipation plate 5 and the heat sink 4. The heat-dissipation plate 5 and the heat sink 4 together dissipate the heat from the first heat source 1 and the second heat source 2, and the heat-dissipation effect of the add-in module M is uniformed and stabilized.

Figure 3:
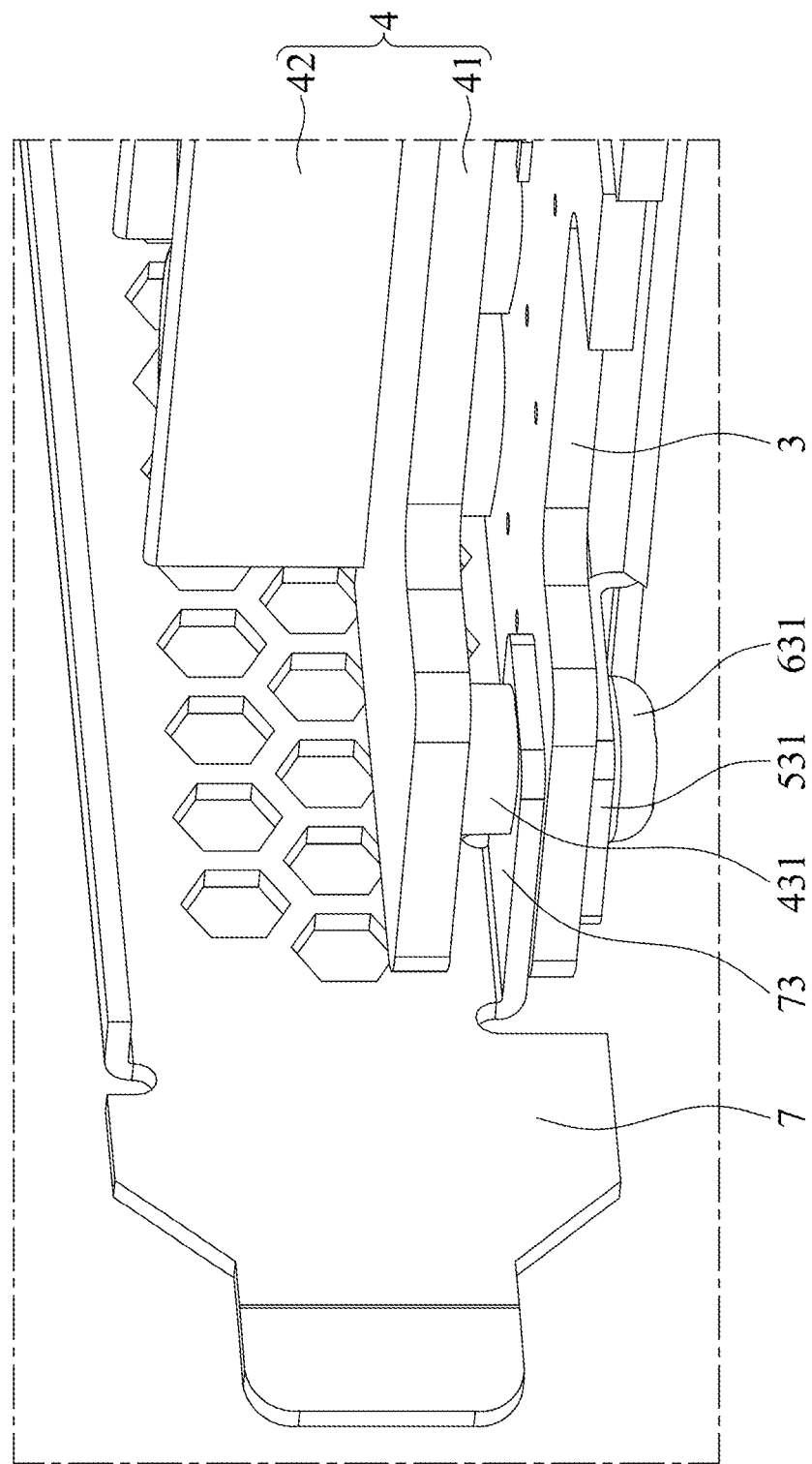
FIG. 3 shows the details of the elements adjacent to the bracket of the embodiment of the invention.

With reference to FIG. 2A, in one embodiment, the add-in module further comprises a bracket 7. The bracket 7 comprises a plurality of bracket fastening portions 73. The fasteners 63 comprise a plurality of first fasteners 631. The posts 43 comprise a plurality of first posts 431. FIG. 3 shows the details of the elements adjacent to the bracket of the embodiment of the invention. With reference to FIGS. 2A and 3, the first fasteners 631 pass through the corresponding first protruding portions 531, the substrate 3, the bracket fastening portions 73 and are affixed to the first posts 431.

Figure 4:
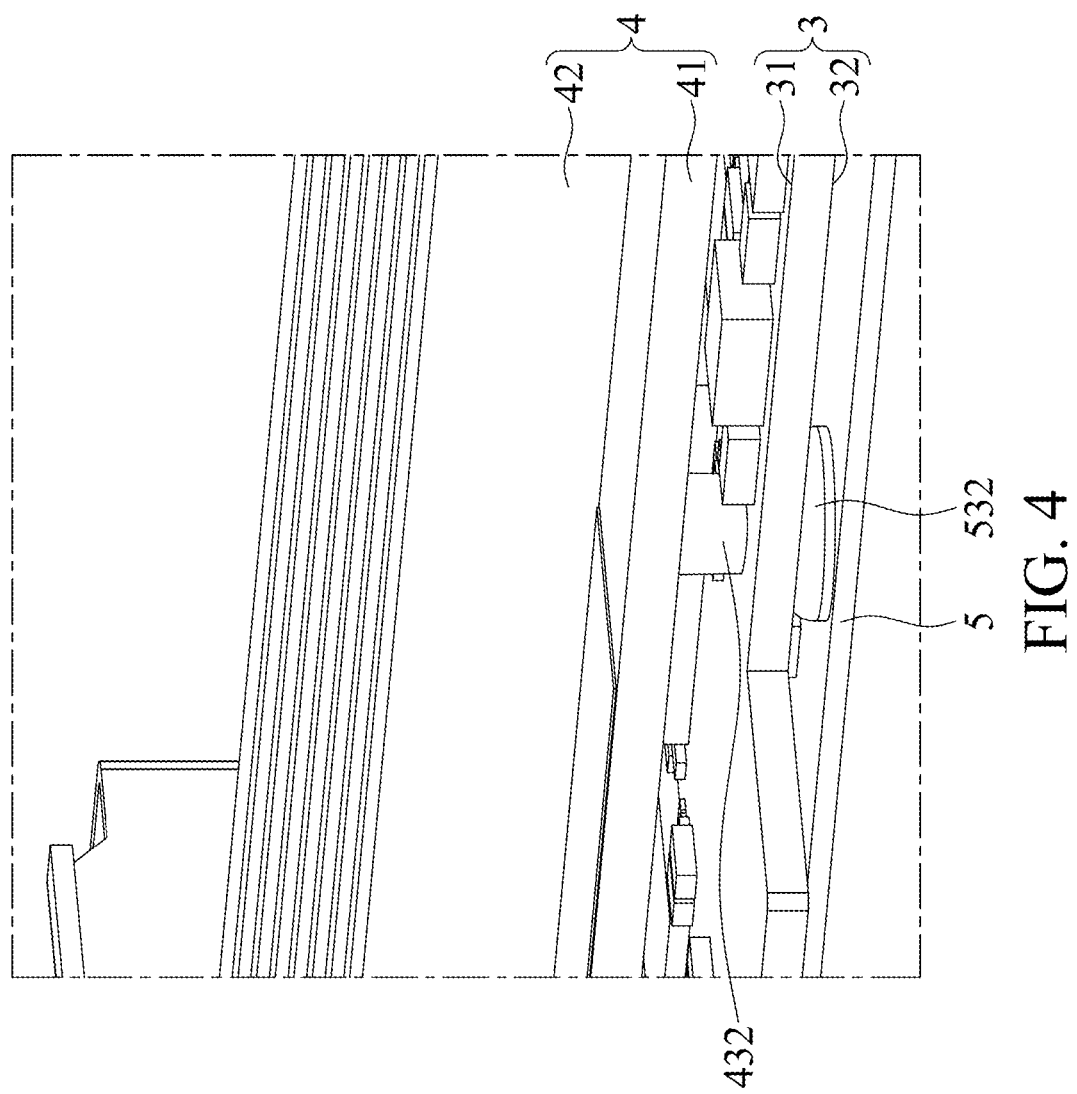
FIG. 4 shows the post abutting the substrate of the embodiment of the invention.

FIG. 4 shows the post abutting the substrate of the embodiment of the invention. With reference to FIGS. 2A and 4, in one embodiment, the fasteners 63 comprise a plurality of second fasteners 632. The posts 43 comprise a plurality of second posts 432. The second fasteners 632 pass through the corresponding second protruding portions 532, the substrate 3 and are affixed to the second posts 432. With reference to FIGS. 2A, 3 and 4, the first posts 431 abut the bracket fastening portions 73, and the second posts 432 abut the substrate 3. In this embodiment, the first posts 431 abut and are thermally connected to the bracket fastening portions 73. The bracket 7 therefore also provides quite heat-dissipation function.

With reference to FIGS. 3 and 4, in this embodiment, the posts 43 (including the first posts 431 and the second posts 432) keep the distance between the heat-sink base 41 and the first substrate surface 31. The first heat-conductive elements 61 therefore can be sandwiched between first heat sources 1 and the heat-sink base 41 and provide sufficient heat-dissipation effect. Similarly, the protruding portion 53 (including the first protruding portions 531 and the second protruding portions 532) keeps the distance between the heat-dissipation plate 5 and the second substrate surface 32.

The second heat-conductive elements 62 therefore can be sandwiched between second heat sources 2 and the heat-dissipation plate 5 and provide sufficient heat-dissipation effect.

With reference to FIGS. 1A and 2A, in one embodiment, the add-in module further comprises a capacitor 39. The capacitor 39 is disposed on the first substrate surface 31. A base notch 44 is formed on the heat-sink base 41, and the capacitor 39 passes through the base notch 44.

In the add-in module of the embodiment of the invention, the heat sink removes the heat from the first heat sources which are disposed on the first substrate surface, and the heat-dissipation plate removes the heat from the second heat sources which are disposed on the second substrate surface. The heat generated by the heat sources (including the first heat sources and the second heat sources) can be effectively removed. The temperature of the all heat sources is prevented from being raised too high. The heat sources are prevented from being overheated, and the add-in module is prevented from being damaged. The add-in module thus has improved reliability. Additionally, the heat-dissipation plate is a thin plate, and the heat-dissipation plate is prevented from being interfered with other adjacent elements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An add-in module, comprising:
   a substrate, comprising a first substrate surface and a second substrate surface, wherein the first substrate surface is opposite the second substrate surface;
   a plurality of first heat sources, disposed on the first substrate surface;
   a plurality of second heat sources, disposed on the second substrate surface;
   a heat sink, corresponding to the first substrate surface and thermally connected to the first heat sources, wherein the heat sink comprises a heat-sink base and a plurality of heat-dissipation fins, and the heat-dissipation fins are connected to the heat-sink base;
   a heat-dissipation plate, corresponding to the second substrate surface and thermally connected to the second heat sources, wherein the first heat sources comprise a central processor chip and a plurality of first memory chips, and the second heat sources comprise a plurality second memory chips;
   a plurality of first heat-conductive elements, each of the first heat-conductive elements is disposed between each of the first heat sources and the heat-sink base, and each of the first heat-conductive elements is thermally connected to a respective one of the first heat sources and the heat-sink base;
   a plurality of second heat-conductive elements, each of the second heat-conductive elements is disposed between each of the second heat sources and the heat-dissipation plate, and each of the second heat-conductive elements is thermally connected to a respective one of the second heat sources and the heat-dissipation plate;
   a plurality of fasteners, wherein the fasteners are affixed to the substrate, the heat sink and the heat-dissipation plate, wherein the heat-dissipation plate comprises a plurality of protruding portions, the fasteners pass through the protruding portions, each of the protruding portions has a top surface, and the top surface abuts the second substrate surface, wherein the heat sink comprises a plurality of posts, each of the posts comprises a fastening hole, the posts correspond to the protruding portions, and each of the fasteners passes through a corresponding one of the protruding portions and is affixed to the fastening hole of a corresponding one of the posts; and
   a bracket, wherein the protruding portions comprises a plurality of first protruding portions, the bracket comprises a plurality of bracket fastening portions, the fasteners comprise a plurality of first fasteners, the posts comprise a plurality of first posts, the first fasteners pass through a corresponding one of the first protruding portions, the substrate, and the bracket fastening portions and are affixed to the first posts.

2. The add-in module as claimed in claim 1, wherein the fasteners further comprise a plurality of second fasteners, the protruding portions further comprise a plurality of second protruding portions, the posts comprise a plurality of second posts, the second fasteners pass through a corresponding one of the second protruding portions and the substrate and are affixed to the second posts, the first posts abut the bracket fastening portions, and the second posts abut the substrate.

3. The add-in module as claimed in claim 1, further comprising a capacitor, wherein the capacitor is disposed on the first substrate surface, a base notch is formed on the heat-sink base, and the capacitor passes through the base notch.

* * * * *